(12) United States Patent
Glatfelter et al.

(10) Patent No.: US 10,497,159 B2
(45) Date of Patent: Dec. 3, 2019

(54) SYSTEM AND METHOD FOR AUTOMATICALLY GENERATING ILLUSTRATIONS

(71) Applicant: The Boeing Company, Chicago, IL (US)

(72) Inventors: John W. Glatfelter, Kennett Square, PA (US); Stuart A. Galt, Maple Valley, WA (US); Raymond C. Sharp, III, Newark, DE (US)

(73) Assignee: The Boeing Company, Chicago, IL (US)

( * ) Notice: Subject to any disclaimer, the term of this patent is extended or adjusted under 35 U.S.C. 154(b) by 3 days.

(21) Appl. No.: 15/799,014

(22) Filed: Oct. 31, 2017

(65) Prior Publication Data

US 2019/0130617 A1 May 2, 2019

(51) Int. Cl.
| | |
|---|---|
| *G06T 11/60* | (2006.01) |
| *G06F 17/50* | (2006.01) |
| *G06T 19/00* | (2011.01) |
| *G06T 15/20* | (2011.01) |

(52) U.S. Cl.
CPC .............. *G06T 11/60* (2013.01); *G06F 17/50* (2013.01); *G06T 15/20* (2013.01); *G06T 19/00* (2013.01); *G06T 2219/008* (2013.01)

(58) Field of Classification Search
None
See application file for complete search history.

(56) References Cited

U.S. PATENT DOCUMENTS

| | | | |
|---|---|---|---|
| 9,292,180 B2* | 3/2016 | Gass | G06F 3/0484 |
| 2003/0206166 A1* | 11/2003 | Kamata | G06T 15/10 |
| | | | 345/427 |
| 2014/0075294 A1* | 3/2014 | Hadley | G06F 16/54 |
| | | | 715/243 |
| 2016/0004791 A1* | 1/2016 | Hollmann | G06F 17/50 |
| | | | 700/98 |
| 2017/0060384 A1* | 3/2017 | Baardse | G06F 3/04842 |

OTHER PUBLICATIONS

Szymanowski et al.; "Challenges for Interactive Electronic Technical Publications in Military Aviation;" The 1st international workshop and congress on eMaintenance Jun. 22-24, 2010, Luleå, Sweden; ISBN 978-91-7439-120-6, pp. 190-195 (Year: 2010).*
Trimble, "Novapoint Layout Generator", pp. 1-3, retrieved on Oct. 30, 2017, retrieved from Internet http://resourcecenter.novapoint.com/doku.php?id=en:np:road:ribbon_in_cad:professional:draw:drawing_generator:plan_and_profile:plan_and_profile_layout_generator.
Solidworks, "3D CAD Automatic Drawing View Creation and Update", pp. 1-2, retrieved on Oct. 30, 2017, retrieved from Internet http://www.solidworks.com/sw/products/3d-cad/automatic-drawing-view-creation-update.htm.

* cited by examiner

*Primary Examiner* — Edward Martello
(74) *Attorney, Agent, or Firm* — Coats & Bennett, PLLC

(57) ABSTRACT

A computing device obtains information associated with a computer aided design (CAD) model of an object, and also determines how an illustration of the object would be utilized. Based on that information, the computing device automatically generates views of the object for inclusion in technical publications related to the object, or a system that includes the object.

21 Claims, 12 Drawing Sheets

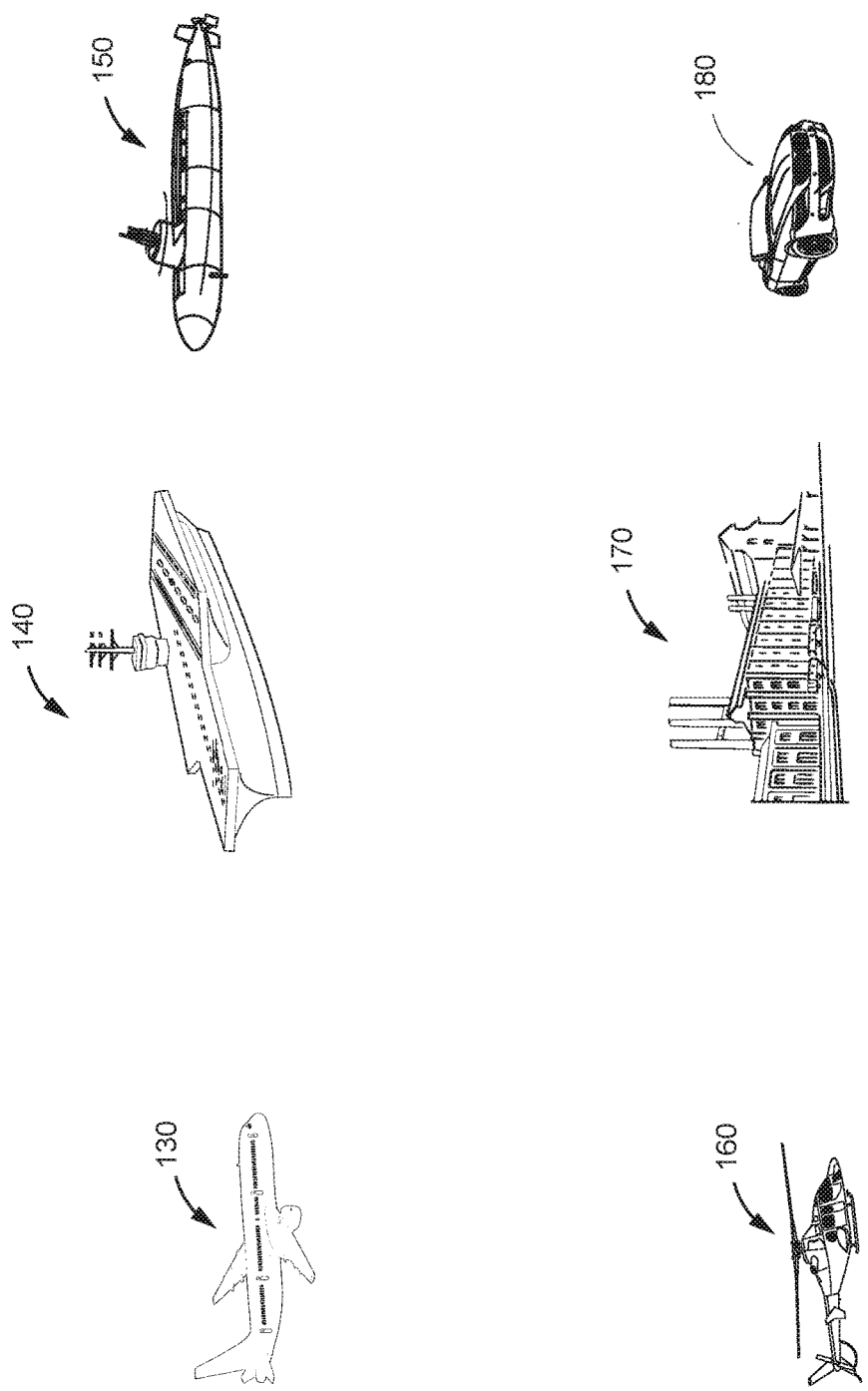

SYSTEM AND METHOD FOR AUTOMATICALLY GENERATING ILLUSTRATIONS

TECHNICAL FIELD

The present disclosure relates generally to computing devices, and more particularly, to computing devices configured to generate illustrations for technical publications.

BACKGROUND

Technical publications, Interactive Electronic Technical Manuals (IETMs), Illustrated Parts Breakdown (IPB) manuals, user manuals, maintenance manuals, and other parts catalogs, are often utilized to support maintenance procedures and tasks for complex systems, such as modern aircrafts, ships, submarines, and industrial facilities. Although these publications can typically be distributed in paper form, they can also be distributed electronically as part of an on-line system. Many publications include drawings or sketches that graphically illustrate a part or parts assembly, as well as the step-by-step procedures required for performing a maintenance task related to the parts or assembly. In many cases, such manuals exceed many thousands of pages and comprise hundreds or thousands of different illustrations. Thus, creating and managing the many permutations of the illustrations included in these publications is both time consuming and costly.

BRIEF SUMMARY

Aspects of the present disclosure relate to methods, apparatuses, and computer program products configured to automatically create the views of a given object for a technical publication based, in part, on information and data that is already included with a Computer Aided Design (CAD) model of the object to be illustrated, as well as on use-case information defining how the view will be used. The generated views are then stored in a repository of views for subsequent inclusion in a desired publication.

In particular, a computing device implementing aspects of the present disclosure comprises interface circuitry configured to send and receive data, and processing circuitry operatively connected to the interface circuitry. The processing circuitry is configured to generate a reference coordinate system for an object to be illustrated to a user based on a vantage point of the user and an orientation vector, wherein the reference coordinate system defines one or more axes about which a view of the object can be rotated, and wherein the orientation vector defines an orientation of the view, determine which part of the object is a portion of interest based on metadata associated with the object and use-case information associated with the view, define an orientation relationship for the view relative to the vantage point of the user based on the vantage point of the user and on the use-case information, and generate the view of the object to display to the user based on the orientation relationship, wherein the view is generated to visually emphasize the portion of interest.

In one aspect, in order to determine the vantage point of the user, the processing circuitry obtains a viewing vector for the object, and then determines the vantage point based on the viewing vector. The viewing vector defines a distance and direction from which the user will visually perceive the view of the object, while the vantage point defines a location from which the user will visually perceive the view of the object.

In one aspect, to determine the vantage point, the processing circuitry determines an object type for the object based on information associated with the object, and executes a linear extrapolation algorithm to calculate the vantage point based on the object type.

In some aspects, the use-case information associated with the object comprises information indicating how the view of the object will be used.

In one aspect, to determine which part of the object is a portion of interest, the processing circuitry determines the geometry for the object.

Additionally, in one aspect, the processing circuitry determines a number and type of views to generate based on the use-case information.

In one aspect, the orientation vector defines a top and a bottom of the view relative to the vantage point.

Further, in one aspect, the processing circuitry determines how much of the object is to be generated for the view for context.

In another aspect, the processing circuitry obtains material property information associated with the object, and determines how much of the object to generate in the view based on the material property information.

In one aspect, the processing circuitry obtains a Computer-Aided Design (CAD) file comprising the metadata associated with the object.

In another aspect, the present disclosure provides a method of generating views for technical illustrations. In this aspect, the method comprises generating a reference coordinate system for an object to be illustrated to a user based on a vantage point of the user and an orientation vector, wherein the reference coordinate system defines one or more axes about which a view of the object can be rotated, and wherein the orientation vector defines an orientation of the view, determining which part of the object is a portion of interest based on metadata associated with the object and use-case information associated with the view, defining an orientation relationship for the view relative to the vantage point of the user based on the vantage point of the user and on the use-case information, and generating the view of the object to display to the user based on the orientation relationship. The view is generated to visually emphasize the portion of interest.

In one aspect, the method also comprises determining the vantage point of the user by determining a viewing vector for the object, wherein the viewing vector defines a distance and direction from which the user will visually perceive the view of the object, and determining the vantage point based on the viewing vector, wherein the vantage point defines a location from which the user will visually perceive the view of the object.

In one aspect, determining the viewing vector for the object comprises determining the viewing vector from geometry information associated with the object. Additionally, determining the vantage point comprises determining the vantage point based on information identifying the object.

In one aspect, the use-case information associated with the object comprises information identifying the object, and information indicating how the view of the object will be used.

In one aspect, determining which part of the object is a portion of interest is based on a geometry associated with the object.

In one aspect, the method also comprises determining a number and type of views to generate based on the use-case information.

In one aspect, the orientation vector defines a top and a bottom of the view relative to the vantage point.

In one aspect, the method further comprises obtaining material property information associated with the object, and determining how much of the object is to be generated for the view for context based on the material property information.

In one aspect, the Computer-Aided Design (CAD) file comprises the metadata associated with the object.

Additionally, in another aspect, the present disclosure provides a non-transitory computer-readable storage medium having computer instructions stored thereon that, when executed by a processing circuit configured to generate views of an object for technical illustrations, causes the processing circuit to generate a reference coordinate system for an object to be illustrated to a user based on a vantage point of the user and an orientation vector, wherein the reference coordinate system defines one or more axes about which a view of the object can be rotated, and wherein the orientation vector defines an orientation of the view, determine which part of the object is a portion of interest based on metadata associated with the object and use-case information associated with the object, define an orientation relationship for the object relative to the vantage point of the user based on the vantage point of the user and on the use-case information, and generate the view of the object to display to the user based on the orientation relationship, wherein the view is generated to visually emphasize the portion of interest.

BRIEF DESCRIPTION OF THE DRAWINGS

Aspects of the present disclosure are illustrated by way of example and are not limited by the accompanying figures with like references indicating like elements.

FIG. 8 illustrates types of complex systems for which publications including views can be generated according to aspects of the present disclosure.

DETAILED DESCRIPTION

Figure 1:
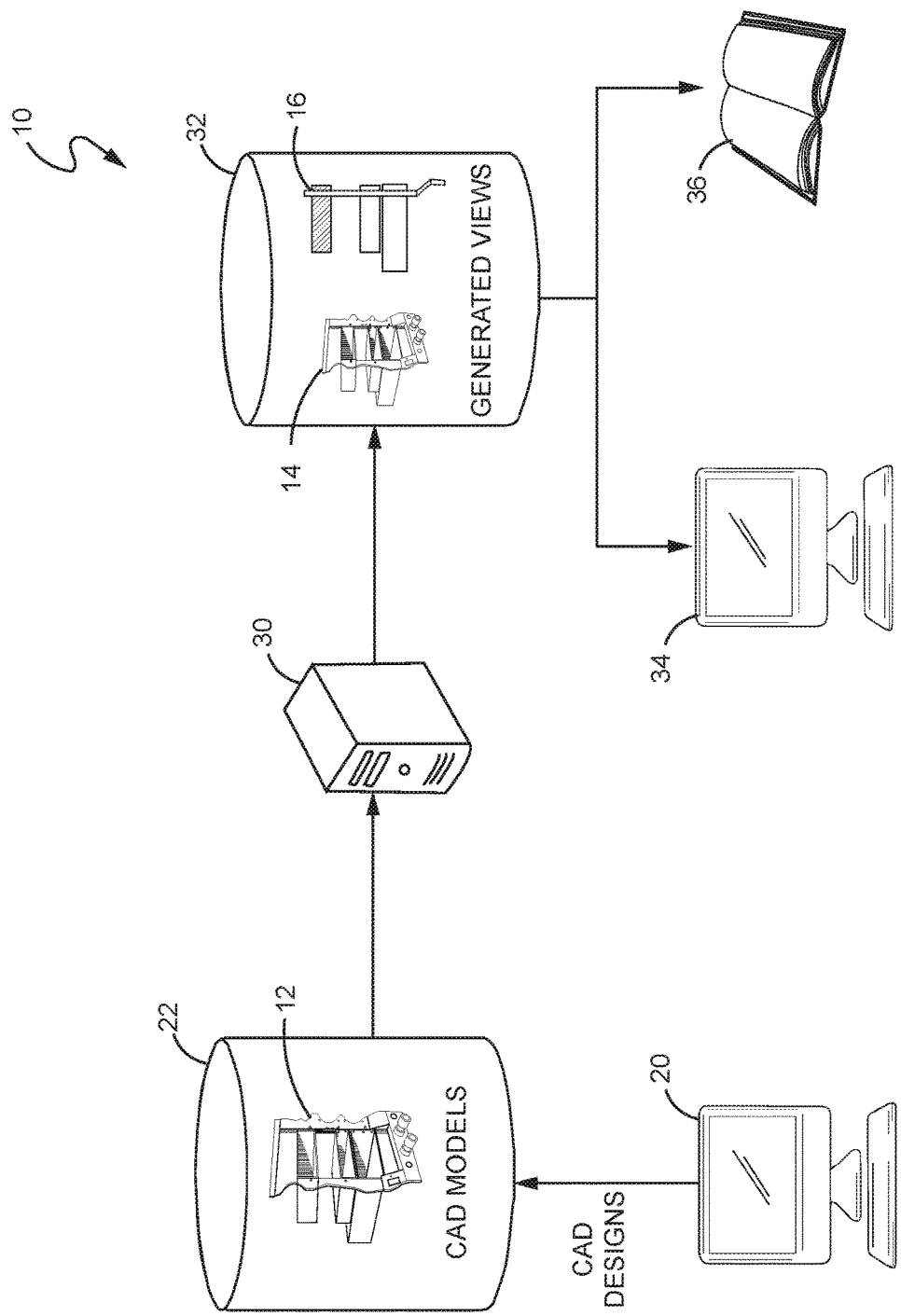
FIG. 1 is a block diagram illustrating a system configured to generate views of an object based on data included in a Computer Aided Design (CAD) model of the object according to one aspect of the present disclosure.

For illustrative purposes only, aspects of the disclosure refer to an "object" as comprising any physical item that can be modeled using Computer Aided Design techniques. Such objects include, but are not limited to, parts, assemblies, sub-assemblies, systems, sub-systems, and the like. Further, aspects of the present disclosure describe the object as being associated with an aircraft. However, those of ordinary skill in the art will realize that the aspects described herein are not limited to objects associated with an aircraft. As seen in more detail later, such objects can be associated with vehicles other than aircraft including, but not limited to, submersible vehicles, rotorcraft, surface craft, automobiles, structures, buildings, and complexes such as industrial/nuclear complexes.

Technical publications, regardless of whether they are printed documents or part of an on-line system of documents, often include drawings or sketches (i.e., "views") of an object. The views can depict any of a variety of different objects which as previously stated include, but not limited to, parts, assemblies, systems, sub-assemblies, sub-systems, and the like. Depending on the type of publication, the views help to graphically illustrate both the part(s) and/or the step-by-step procedures required for performing a particular maintenance task.

The creation, maintenance, and management of such publications is notoriously labor intensive and costly. Additionally, technical publications require periodic updates to ensure they remain "up to date." Updates include, but are not limited to, the generation of new views of an object, the modification of existing views already present in a publication, and the deletion of views associated with parts or procedures that have become obsolete.

Conventional processes for revising the views included in a publication only complicates an already challenging procedure. Further, such conventional processes can exacerbate the labor and cost requirements associated with technical publications. Aspects of the present disclosure, however, provide a device, a method, and a corresponding computer readable storage medium configured to automatically create the views of a given object for inclusion in a technical publication. The generation of the views, as described in more detail below, is based, at least in part, on information and data that is already included with a Computer Aided Design (CAD) model of the object to be illustrated, as well as on "use-case information" defining how the view will be used (e.g., in what type of on-line and/or printed publication the generated view(s) will appear, the type of procedure and/or procedural the view(s) will help illustrate, a particular task or set of tasks that is to be performed, and the like).

For example, consider the differences between how parts manuals are used and how maintenance manuals are used. Parts manuals are focused on identifying the parts of a given system or assembly, while maintenance manuals are focused on the step-by-step procedures associated with the system or assembly. Both manuals include technical illustrations of the parts or assemblies of interest; however, in general, the number and types of views of a given part or system are different for both types of publications. For example, a parts catalog could only require one or two views of a given part. The number and types of which are generated to ensure that an end user is able to confidently identify and order/re-order the part. On the other hand, a maintenance manual can require more than one or two views of the same part, the number and types of which are generated so as to clearly illustrate the installation of the part (or maintenance or removal). The number and types of views that are generated in can be determined, at least in part, based on a variety of different considerations including, but not limited to, one or more of the complexity of the procedure associated with the views, the size and/or intended use of the particular part or system that is the subject of the generated view(s), placement or positioning of the object relative to the placement and/or positions of other items or objects that occlude the object, and the like.

Conventionally, to generate or revise the illustrations in such publications, the expertise of graphics artists or other specially trained personnel is required to manually create and revise the many different views of each different part or assembly for each different publication. With the aspects of the present disclosure, however, no such special training or expertise is required. Rather, the views for both a parts catalog and a technical manual (or any other publication in which a technical illustration is needed or desired), are easily and quickly generated, maintained, and utilized to ensure such publications are created and updated in a timely and cost effective manner.

Turning now to the drawings, FIG. 1 is a block diagram illustrating a system 10 configured to generate one or more views of an object for a technical publication according to one aspect of the present disclosure. Those of ordinary skill in the art will readily appreciate that the components seen in FIG. 1 are illustrative only, and that other components can (and sometimes do) exist in various aspects of system 10, even though those components are not explicitly depicted in the figures.

As seen in FIG. 1, system 10 comprises a workstation 20 configured for CAD design, and an Application Server (AS) 30. Workstation 20 executes CAD software that allows a user to create, modify, analyze, and optimize, the design of an object on computing device 20. In this aspect, workstation 20 is utilized to design a CAD model of an equipment rack 12, which is then stored in a CAD repository 22. The AS 30, which executes a view generation function described in more detail later, obtains the CAD model of equipment rack 12 as input, processes the CAD model according to the aspects of the present disclosure, and outputs one or more views 14, 16 of rack 12 for storage in a view repository 32. As described in more detail later, the views 14, 16 that are generated according to the present disclosure are generated based on the information and data included in the CAD model of rack 12, as well as on use-case information indicating how the view will be used.

In one aspect, the views 14, 16 that are stored in repository 32 are then included in a publication and distributed to a variety of end users. As seen in FIG. 1, such publications include an on-line parts catalog 34 identifying each component part in the rack 12, and a printed technical manual 36 defining the step-by-step procedures for installing, maintaining, or removing the rack 12 or portion thereof. However, as those of ordinary skill in the art will readily appreciate, other types of publications—both on-line and printed—are suitable for use with aspects of the present disclosure. Regardless of how the views 14, 16 will ultimately be utilized the view generation function executing on AS 30, as described in more detail later, generates appropriate views for the each of the on-line parts catalog 34, the technical manual 36, and other publications in which views of rack 12 are desired or needed.

Figure 2:
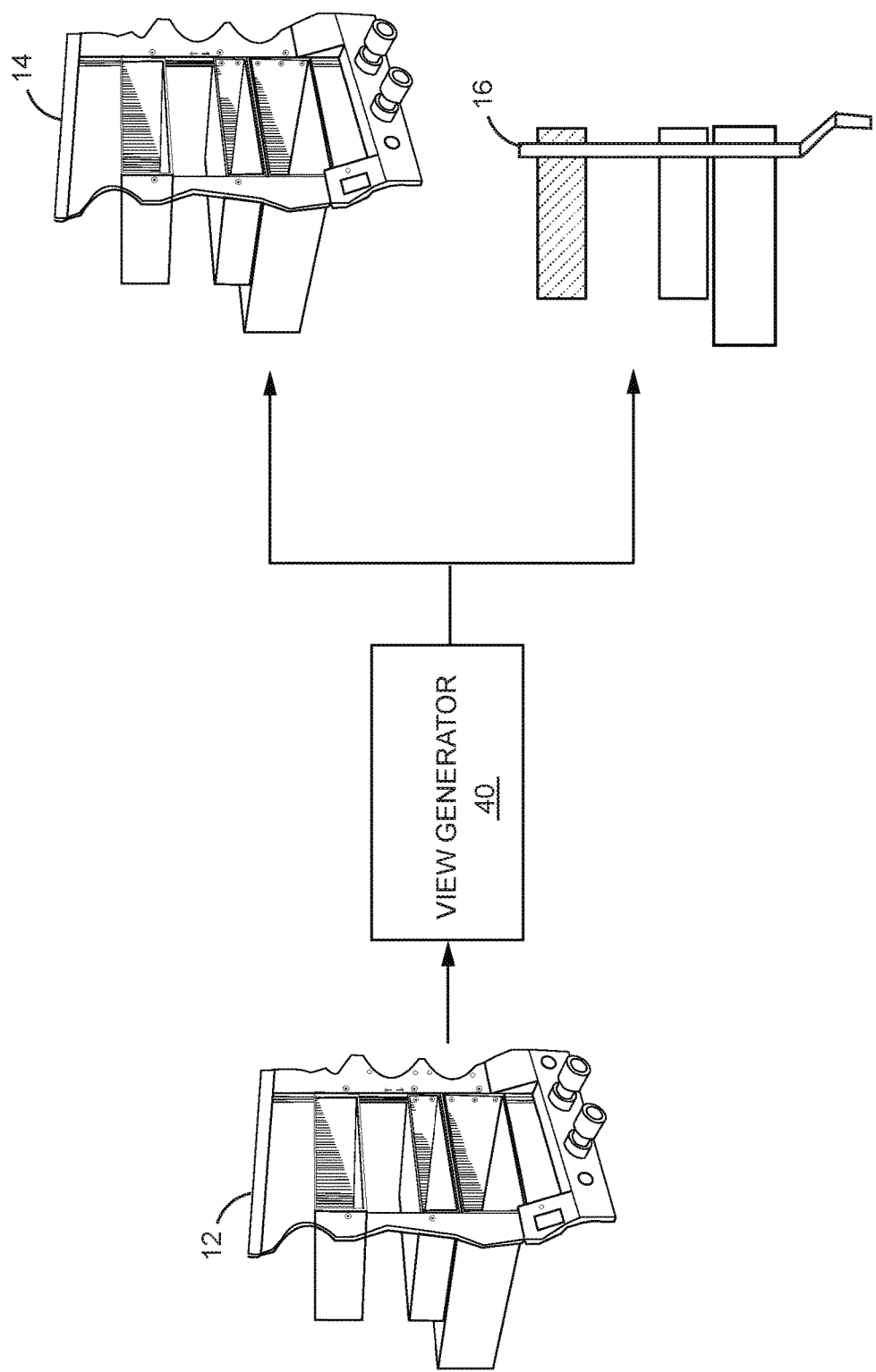
FIG. 2 is a block diagram illustrating a view generation function configured to generate one or more views of an object from a CAD model of the object according to one aspect of the present disclosure.

FIG. 2 is a block diagram illustrating a view generator 40 configured to generate views 14, 16 according to aspects of the present disclosure. As stated previously, AS 30 obtains the CAD model of rack 12, which is stored in a CAD file comprising CAD data, from repository 22, for input into the view generator 40 executing on AS 30. Such CAD data includes, but is not limited to, geometric information describing rack 12 (e.g., surfaces, wire frame model, solid geometry data, etc.), metadata defining the non-graphical attributes of rack 12, design data (e.g., history tree information, formulae, rules, guidelines, etc.), and application data (e.g., numerical control tool path information, geometric dimensioning and tolerance information, process planning information, assembly structure data, etc.). Other data and information can be included in the content of the CAD model of rack 12, as needed or desired.

Responsive to receiving the CAD model of rack 12, view generator 40 analyzes the CAD data in the CAD model to determine certain attributes and other information needed to generate views 14, 16. In one aspect, view generator 40 determines, from the CAD data, the geometry of rack 12, as well as how the views 14, 16 will be utilized. Based on the determined geometry and "use-case" information, view generator 40 generates views 14, 16 and outputs them to view repository 32 for storage.

Additionally, view generator 40 generates views 14, 16 so that particular parts of interest of the rack 12 are visually emphasized. In this aspect, view generator 40 generates views 14, 16 to visually emphasize a top shelf of rack 12. This allows an end user to quickly and easily discern the top shelf of rack 12 (or any other particular part of interest) from the other component parts of rack 12, as well as any other equipment or components proximate rack 12 when is installed in its typical operational environment.

In some aspects, view generator 40 can also determine whether any of the equipment or components that are proximate rack 12 should be included in generated views 14, 16 for context, and if so, include those components when generating views 14, 16. This helps end users looking at the views 14, 16 to quickly and easily identify what they are seeing in the views 14, 16, and orient what they are seeing to the actual, physical rack 12. Sometimes, though, these so-called "contextual" components (or other parts of rack 12) can obstruct the end user's view of a particular portion of interest. Accordingly, in one aspect of the present disclosure, view generator 40 is also configured to remove or at least "visually de-emphasize" the contextual components and/or any other parts of rack 12 when generating views 14, 16 to ensure that the user can clearly see the part or parts of interest.

As an illustrative example, consider an environment in which the top shelf of an actual physical rack 12 is behind an access panel. In these situations, view generator 40 can, in one aspect, identify the presence of the access panel and remove it from the views 14, 16 (e.g., by generating the views 14, 16 without the access panel). In another aspect, when the access panel is to be included in the generated views 14, 16, view generator 40 generates views 14, 16 to "visually de-emphasize" the access panel (e.g., by rendering the access panel in phantom or in dashed lines). In either aspect, view generator 40 generates views 14, 16 to ensure that an end user is able to quickly and easily discern the portions of interest of rack 12 that are behind the access panel.

Figure 3:
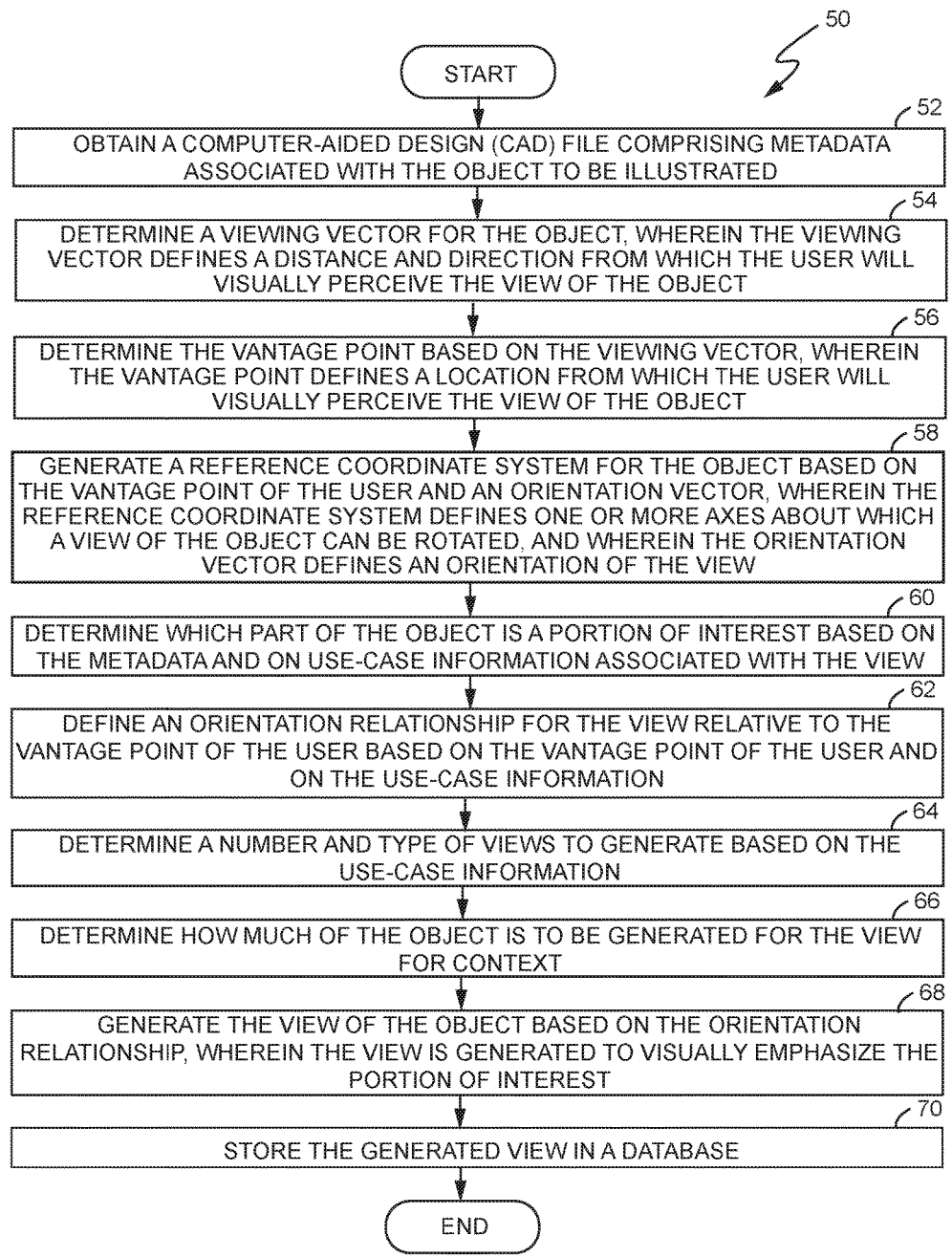
FIG. 3 is a flow diagram illustrating a method of generating one or more views of an object from a CAD model of the object according to one aspect of the present disclosure.

FIG. 3 is a flow diagram illustrating a method of generating one or more views 14, 16 of rack 12 according to one aspect of the present disclosure. FIGS. 4A-4E are used as context for the method of FIG. 3, and graphically illustrate the functions performed by view generator 40 when generating views 14, 16.

Figure 4A:
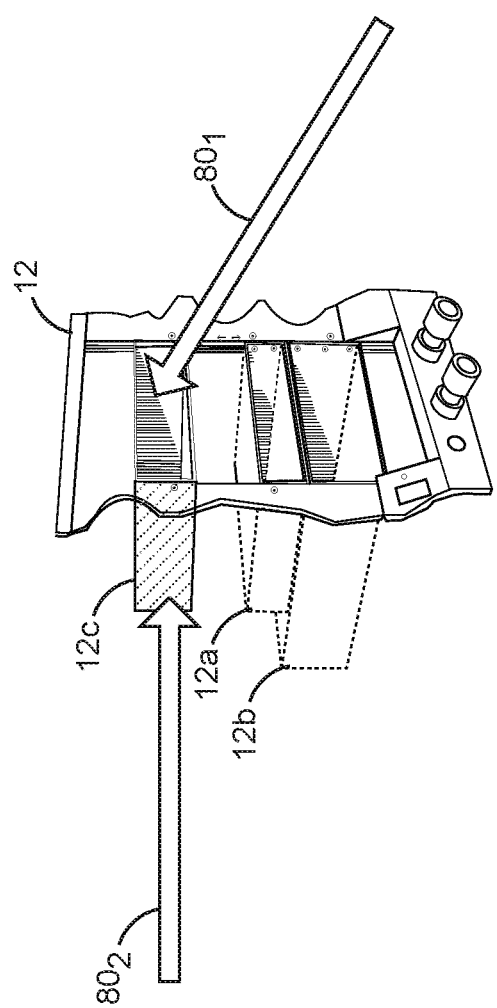
FIGS. 4A-4E graphically illustrate functions of a view generator configured according to one aspect of the present disclosure.

As seen in FIGS. 3 and 4A, method 50 begins with view generator 40 obtaining a CAD file, such as the CAD file comprising the CAD model of rack 12 and metadata associated with the CAD model of rack 12, from a database or other memory device (box 52). As previously stated, the CAD model can be retrieved from CAD repository 22 by AS 30. In other aspects, however, the CAD model can be provided as input to view generator 40 by a user. In these latter aspects, the user can identify a location for a desired CAD model file using a Uniform Resource Locator (URL) or other such identifying link.

Once the CAD file comprising the CAD model of rack 12 has been obtained, view generator 40 determines one or more viewing vectors $80_1$, $80_2$ for rack 12 (box 54). Each viewing vector $80_1$, $80_2$ defines a distance and direction from which a user would visually perceive the generated views 14, 16 of rack 12 as if the user were looking at rack 12 in a physical environment along those vectors. In some aspects, the metadata included in the CAD file includes information expressly identifying the one or more viewing vectors $80_1$, $80_2$. In these aspects, then, view generator 40 simply retrieves the information defining the one or more viewing vectors $80_1$, $80_2$. In other aspects, however, the CAD model does not include all or some of the data explicitly defining the viewing vectors $80_1$, $80_2$. In such cases, view generator 40 is configured to derive the viewing vectors $80_1$, $80_2$ from other information.

Particularly, in one aspect, view generator 40 is configured to derive the viewing vectors $80_1$, $80_2$ from "use-case" information that is included with the CAD model and/or provided by the user. In other aspects, view generator 40 is configured to derive viewing vectors $80_1$, $80_2$ from requirements information input by the user. Regardless of how view generator 40 obtains or derives viewing vectors $80_1$, $80_2$, view generator 40 is configured to determine viewing vectors $80_1$, $80_2$ based at least in part on information that identifies how the views 14, 16 will be utilized in their presentation to the end users.

One such use is when views 14, 16 are utilized as technical illustrations in a maintenance manual illustrating one or more procedural steps or tasks. Another use is when views 14, 16 are utilized as illustrations in a user manual describing an overview of a system associated with rack 12. Other uses include, but are not limited to, when views 14, 16 are utilized as illustrations in a parts catalog or an illustrated parts breakdown (IPB) manual. As is known in the art, an IPB manual, which can be electronically based or printed, comprises a collection or catalog of parts that allows individual users to identify individual parts to order. Regardless of the particular use for views 14, 16, however, view generator 40 utilizes the knowledge of how the views 14, 16 will be utilized to generate the one or more views 14, 16. Generating views 14, 16 based on the knowledge of how the views will be utilized allows view generator 40 to generate the views of an object in a manner that best emphasizes the components and/or portions of interest that are pertinent and appropriate for the given use.

View generator 40 then determines one or more vantage points $82_1$ and $82_2$ for each viewing vector $80_1$, $80_2$, respectively, based on the viewing vectors $80_1$, $80_2$. The vantage points $82_1$ and $82_2$ define a location in virtual space from which the user would visually perceive views 14, 16 if the user were positioned to view rack 12 from those corresponding vantage points $82_1$ and $82_2$ (box 56).

The vantage points $82_1$ and $82_2$ can be determined using any method needed or desired. However, in one aspect, view generator 40 determines vantage points $82_1$ and $82_2$ using a linear extrapolation algorithm. As is known in the art, linear extrapolation is a method for computing the location of a point that lies along a straight line. In one aspect, view generator 40 calculates the locations of the vantage points $82_1$ and $82_2$ using the following general formula:

$$y(x) = y_1 + \frac{x - x_1}{x_2 - x_1}(y_2 - y_1)$$

wherein:

$x_1$, $y_1$, $x_2$, and $y_2$ are the endpoints of a line segment representing a viewing vector; and x is the extrapolated point representing the vantage point.

Once vantage points $82_1$, $82_2$ have been determined, view generator 40 generates a Reference Coordinate System (RCS) $84_1$, $84_2$ for each vantage point $82_1$ and $82_1$. In this aspect, RCS 84 is generated based on vantage points $82_1$ and $82_2$, and on an orientation vector determined by the view generator 40 (box 58).

Figure 4B:
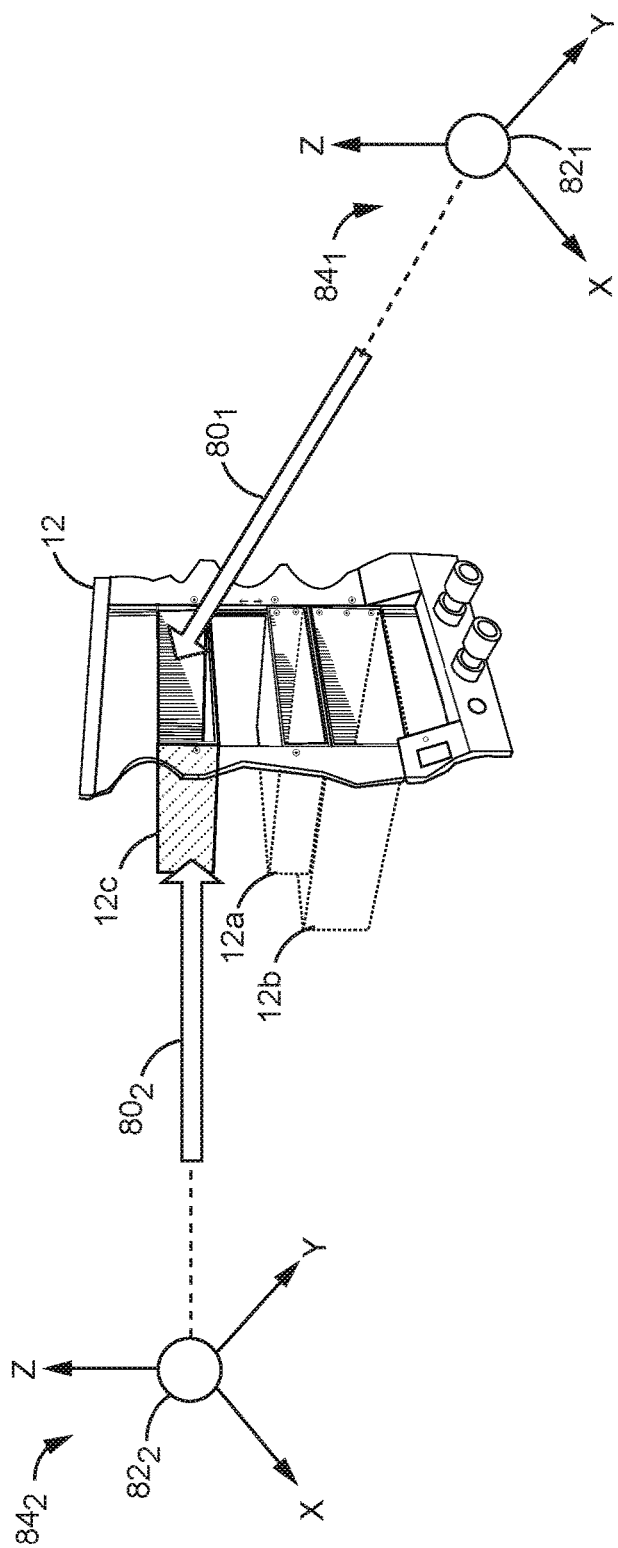
Figure 4C:
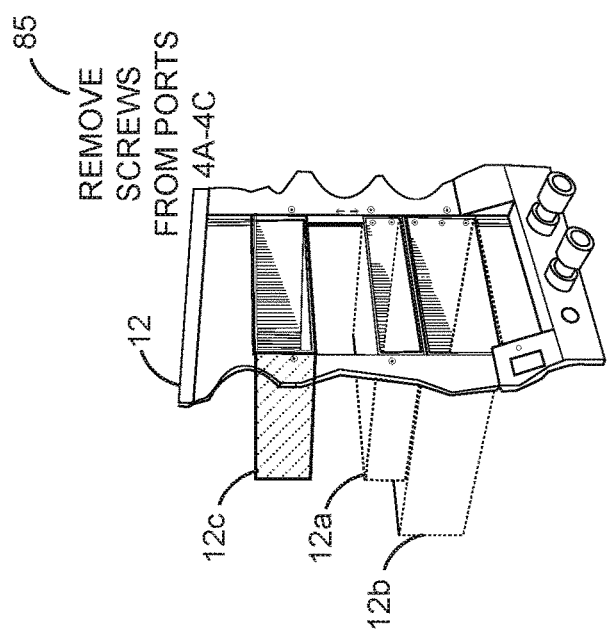

More particularly, as seen in FIG. 4B, RCS 84 comprises one or more axes: an x-axis, a y-axis, and a z-axis, about which the image of rack 12 can be rotated or positioned in 3 dimensions. The orientation vector, or "up-vector," is a vector that defines the top and bottom of a view to be generated. This vector allows the view generator 40 generate views 14, 16 in an orientation that best matches how the end users would actually see the rack 12 in its physical environment, which does not always reflect the conventional notions of up and down. For example, in the physical world, an actual rack 12 can be in any of a variety of positions and/or orientations. Further, when viewing an actual, physical rack 12, an end user could be standing up, prone, upside down, on his or her back, or in any other position. Because the end user is able to assume different positions relative to an actual rack 12 in the physical world, view generator 40 utilizes the orientation vector and the determined vantage points $82_1$ and $82_2$ to generate views 14, 16 to reflect how the end user might actually perceive the actual, physical rack 12.

The view generator 40 is configured to determine the orientation vector in any of a variety of ways. In one aspect, view generator 40 initially determines the orientation vector based on a set of guideline rules stored in memory. In another aspect, view generator 40 determines the orientation vector based on one or more view templates that define the views. In these aspects, the rules and templates comprise a predefined orientation for each view of a given object. In some aspects, view generator 40 is configured to update the orientation vector information based on feedback provided by the end users in situations where the rules and/or templates defining the initial orientation vector information are not as accurate as desired.

For example, in some aspects, view generator 40 includes a "learning mode" in which end users provide feedback as to the quality of the generated views 14, 16. Such feedback includes, but is not limited to, feedback rating the quality of the generated views 14, 16. The view generator 40 utilizes the feedback information from the user to update the orientation information (e.g., the orientation vector) associated with the rules and/or templates so that subsequent views 14, 16 are generated in accordance with the updated orientation information.

In another aspect, orientation vector(s) utilized to generate one or both of the views 14, 16 can be determined based on an analysis of the specific geometry of rack 12, or on the "class of geometry" associated with rack 12. In this latter aspect, view generator 40 treats the geometry of rack 12 the same as, or similar to, the geometry associated with at least some other electronics racks in general. As discussed in more detail later, other, different objects, and classes of objects (e.g., landing gear, circuit assemblies, parts, sub-assemblies, systems, sub-systems, and the like) will often times have orientation vectors that are different from rack 12. Regardless of the type of object, however, determining the geometry of the object, and or the class of geometry for the object, allows the view generator 40 to make generic assumptions for the object. Based on these assumptions, and in some aspects on "use-case information" indicating how the generated views will be utilized (e.g., in a maintenance manual or a parts catalog, etc.), view generator 40 generates views 14, 16 in an orientation that is appropriate for the intended use of the views 14, 16.

Once the RCS 84 has been determined (box 58), view generator 40 determines which part or portion of rack 12 will be of interest to the end user based on the metadata and on the use-case information for the views 14, 16 to be generated (box 60). Particularly, in one aspect, view generator 40 analyzes the information provided with the CAD model of rack 12, or by the user, to determine which portion(s) of rack 12 are of interest to the user. As seen in the aspect of FIGS. 4A-4B, rack 12 comprises a plurality of shelves 12a, 12b, and 12c, each of which is configured to house electronic circuitry configured as one or more cards. Shelf 12c is the shelf of interest in the aspect illustrated in FIG. 4A. So determined, view generator 40 derives the viewing vectors $80_1$, $80_2$ such that the resultant generated views 14, 16 visually emphasize shelf 12c allowing the end user to quickly and easily visually perceive that portion of rack 12, even though other portions of rack 12 are also generated with the views 14, 16.

In one aspect, view generator 40 interrogates the geometry (or class of geometries) associated with rack 12. So obtained, view generator 40 considers the geometry information associated with the rack 12, along with a task that is to be accomplished on or near rack 12. Such information includes, but is not limited to, heuristics information stored in memory accessible by view generator 40, data input into the view generator 40 by a user, the specific geometry of rack 12, and the geometry associated with other racks that are in the same or similar class of racks 12.

View generator 40 then defines the orientation for views 14, 16 based on the determined vantage points $82_1$ and $82_1$ and on the use-case information for the views 14, 16 (box 62), determines a number and type of views to generate based on the use-case information (box 64), and determines how much of the rack 12, and/or the components that are present its surrounding environment, to include for context when generating views 14, 16 (box 66).

For example, if shelf 12c is set behind an access panel in the physical world, then shelf 12c would not be visible to the end user unless the access panel was removed. Accordingly, view generator 40 determines whether shelf 12c (or other component or portion of rack 12) is occluded by surrounding geometry (e.g., an access panel, a side of another shelf, etc.). If shelf 12c is occluded, view generator 40 removes or visually "de-emphasizes" the occlusions when generating views 14, 16. Visually de-emphasizing such occlusions allows a user to view the part of rack 12 that is of particular interest (e.g., shelf 12c) without having to view the parts or assemblies that occlude shelf 12c.

In one aspect, view generator 40 makes the determinations based on textual information related to the task to be performed. As such, view generator 40 analyzes data associated with the CAD model of rack 12 (e.g., materials and/or property information) to determine whether there are any annotations or notes 85 (see FIG. 4C) to be displayed with the generated view 14, 16. Additionally, view generator 40 analyzes the geometry information, and in some aspects, the material and/or property information associated with the CAD model of rack 12, to determine whether the CAD model contains any arcs/lines and other geometry that should be emphasized (e.g., bolded, highlighted, etc.), de-emphasized (e.g., rendered in phantom or dotted relief, etc.), hidden, changed color and/or any other changes to add semantic meaning to the arcs/lines and other geometry in generated views 14, 16. Of course, other data and information can be present and utilized by view generator 40 to generate views 14, 16 as previously described. Regardless of the amount and type of information, view generator 40 determines whether other parts of rack 12, or other components proximate rack 12, occlude the shelf 12c.

Figure 4D:
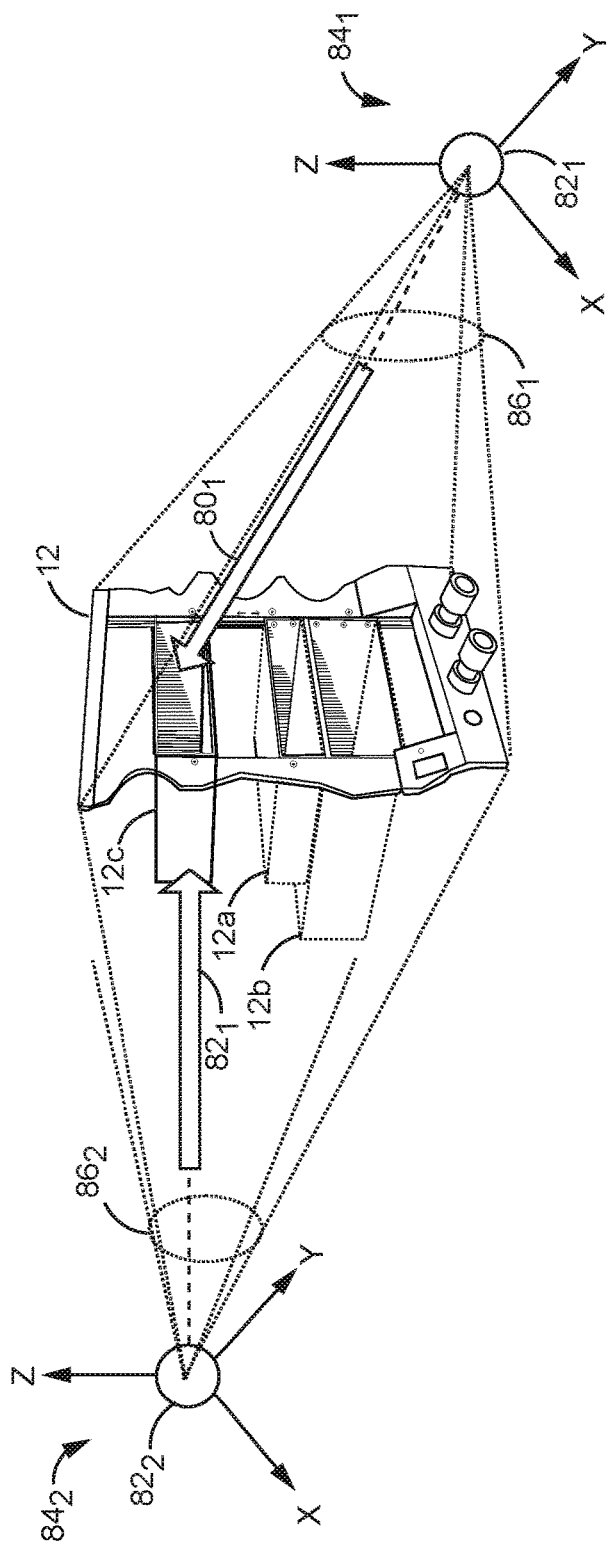

As seen in FIG. 4D, view generator 40 then determines a field of view $86_1$, $86_2$ for the generated views 14, 16. Particularly, view generator 40 determines whether one or both of the views 14, 16 will be generated as wide angle views (e.g., view 14) or narrow angle views (e.g., view 16). Wide angle views will include more of the components surrounding the portion of interest (e.g., the shelf), while a narrower field of view will include fewer components surrounding the portion of interest.

Additionally, view generator 40 can determine how much of the surrounding environment should be visible to the user in the generated views 14, 16. For example, view generator 40 can determine which components surrounding the point of interest should be rendered in views 14, 16 based on the use-case information. In another example, view generator 40 can determine whether shelf 12c should be rendered alone in the generated views 14, 16, which can be helpful in, e.g., a parts catalog, or whether adjacent assemblies or parts should be included in the generated views 14, 16, which could be helpful in, e.g., a maintenance manual associated with rack 12. If any adjacent assemblies or parts should be included in the generated views 14, 16, view generator 40 is configured to obtain the various CAD models for the adjacent assemblies or parts, and then use them to generate views 14, 16.

In one aspect, view generator 40 is configured to determine, based on the material property information associated with the object, how much of the object to generate in views 14, 16, and/or which components that are proximate the point of interest should be rendered in views 14, 16. Material property information comprises data describing the physical characteristics and properties of each component in a CAD model. Such data can include, but is not limited to, data that defines the materials comprising a given component (e.g., steel, silicon, plastic, metals, alloys, composites, ceramics, etc.), the particular properties associated with those materials (e.g., density, temperature, temperature ranges, crystal phases, optical properties, tensile strength, pressure, flow, etc.), notes or annotations associated with the components, geometry information associated with the components, and the like.

Generally, the material property information is utilized to generate complete 2D and/or 3D models of the components in the CAD model, as well as to perform an analysis of the mechanical and/or electrical characteristics and properties of the object (and of the other components). Additionally, however, the material property information is utilized by view generator 40 to generate views 14, 16 such that views 14, 16 include, if needed, one or more components that are proximate the point of interest. The ability to determine such information enables view generator 40 to provide an appropriate amount of context for the user. By way of example only, utilizing the material property information associated with the object, view generator 40 can generate views 14 and/or 16 to include parts, sub-parts, assemblies, and/or sub-assemblies associated with the object that are proximate the point of interest and that are comprised of a substantially transparent plastic material.

In one illustrative aspect, determinations regarding how much of the surrounding environment should be visible to the user in the generated views 14, 16 are based on the material property information associated with the CAD model of rack 12, for example. As stated above, the information includes, but is not limited to, information associated with adjacent parts and/or assemblies, the geometry of the rack 12, the geometry of any surrounding parts or assemblies that can occlude some or all of the portion of interest (e.g., shelf 12c), and information and parameters stored from previous illustrated versions of the view. In this latter aspect, as described above, the view generator 40 can enter a "learning mode" in which view generator 40 refines the information used to generate the views 14, 16 based on feedback information received from the users. For example, view generator 40 can determine whether shelf 12c should be alone in the generated views 14, 16, or whether it would be more helpful to the user if the generated views 14, 16 of shelf 12c include the corresponding shelves 12a, 12b and some or all of the rack 12.

Figure 4E:
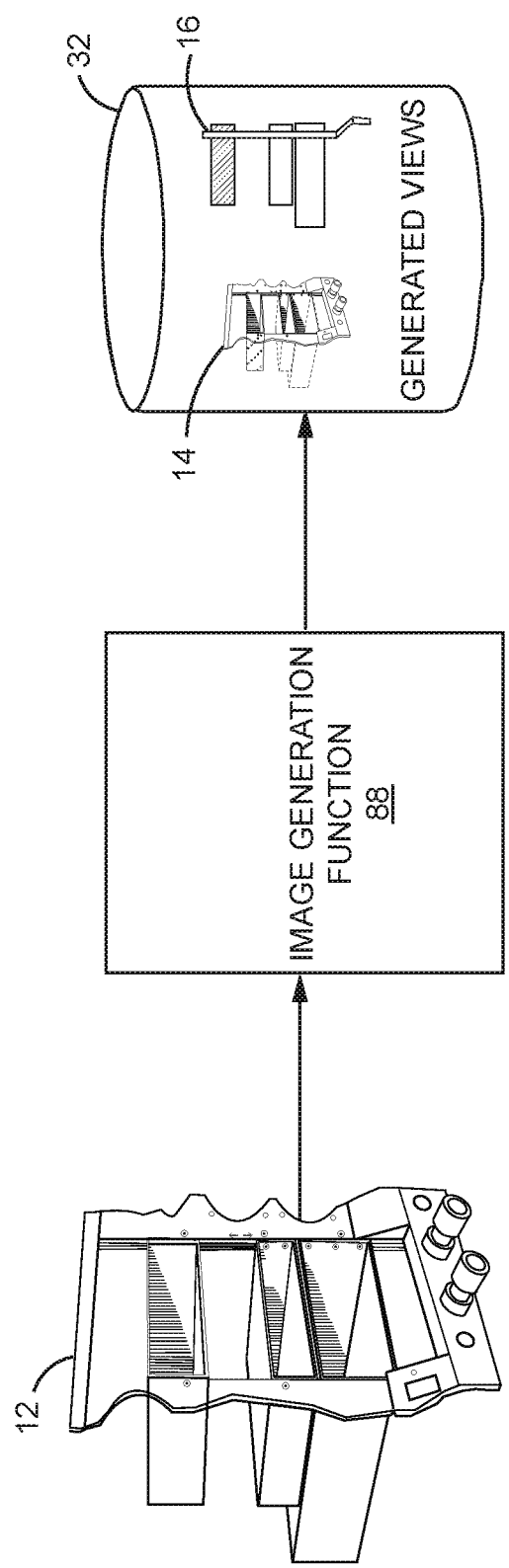

As seen in FIGS. 3 and 4E, view generator 40 then generates the views 14, 16 of rack 12 based on the previously determined orientation relationship (box 68). Specifically, in one aspect, view generator 40 generates views 14, 16 to visually emphasize the portion of interest, and in an orientation that best suits the end use of the views 14, 16. As seen in FIGS. 4D, 4E, the shelf of interest, shelf 12c, is visually highlighted and oriented according to the orientation vector. This allows the user to quickly and easily discern shelf 12c from the other components in views 14, 16 once such views are generated.

To generate views 14, 16, one aspect of view generator 40 comprises an image generator function 88 (FIG. 4E) that generates the views 14, 16 for storage in repository 32 based on the previously determined orientation relationship, use-case information, and vantage points. In one aspect, the views are generated as PDF files, but can be generated as other file types, such as TIF, JPEG, and the like, using any image generator and according to any desired format needed or desired. Regardless of file type and format, however, view generator 40 stores the generated views 14, 16 in the view repository 32 (box 70).

Figure 5:
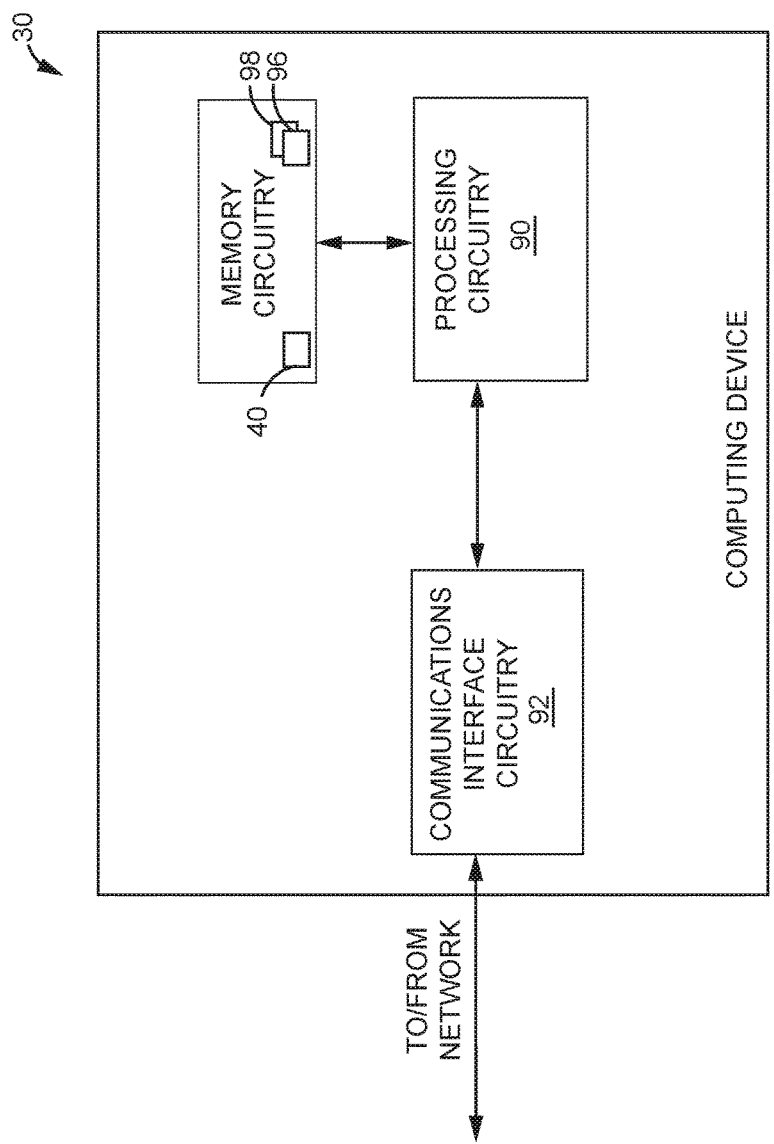
FIG. 5 is a block diagram illustrating a computing device configured according to one aspect of the present disclosure.

FIG. 5 is a block diagram illustrating a computing device, such as AS 30, configured to implement aspects of the present disclosure. In some aspects, AS 30 is implemented as a network server, but in other aspects, is implemented as a standalone computing device outside of the realm of a communications network. Such standalone devices include, but are not limited to, workstations and end user computing devices.

In this aspect, AS 30 comprises processing circuitry 90 communicatively coupled via one or more busses to communications interface circuitry 92 and memory circuitry 94. According to various aspects of the present disclosure, processing circuitry 90 comprises one or more microprocessors, microcontrollers, hardware circuits, discreet logic circuits, hardware registers, digital signal processors (DSP's), field-programmable gate arrays (FPGAS), application-specific integrated circuits (ASIC's), or a combination thereof. In one such aspect, processing circuitry 90 includes programmable hardware capable of executing software instructions stored, for example, as a machine-readable computer control program (e.g., view generator 40) in memory circuitry 94.

More particularly, processing circuitry 90 is configured to execute the view generator 40 to retrieve or obtain CAD models of various objects, such as rack 12, and process and analyze the information contained in those CAD models to generate one or more views of the object of interest for storage in a repository 32. Additionally, processing circuitry 90 is configured to implement the functionality of the view generator 40 in accordance with values, rules, and templates stored in one or more files 96, 98, as well as to send views 14, 16 to the repository 32 once they have been generated.

Communications interface circuitry 92 comprises circuitry configured to control the input and output (I/O) data paths of AS 30. Such I/O data paths include those required for exchanging signals with other computers and mass storage devices over a communications network (not shown), and/or data paths for exchanging signals with a user. Such signals include the data associated with the CAD models stored in repository 22, as well as views 14, 16, that are generated and sent to repository 32 for storage.

Additionally, in some aspects of the present disclosure, interface circuitry 92 comprises I/O circuits and devices configured to allow a user to interface with the AS 30. Such circuitry and devices include, but are not limited to, display devices such as a liquid crystal display (LCD) and/or a light emitting diode (LED) display for presenting visual information to a user, one or more graphics adapters, display ports, video busses, a touch screen, a graphical processing unit (GPU), and audio output devices such as speakers. In some aspects of the present disclosure, communications interface circuitry 92 includes circuitry and devices for accepting input from a user. Such circuitry and devices include a pointing devices (e.g., a mouse, stylus, touch pad, track ball, pointing stick, joy stick), a microphone (e.g., for speech input), an optical sensor (e.g., for optical recognition for gestures), and/or a keyboard (e.g., for text entry). According to particular aspects of the present disclosure, interface circuitry 92 is implemented as a unitary physical component, or as a plurality of physical components that are contiguously or separately arranged, any of which can be communicatively coupled to any other, or communicate with any other component, via processing circuitry 90.

Memory can be implemented as memory circuitry 94 that comprises any non-transitory machine-readable storage media known in the art or that may be developed, whether volatile or non-volatile, including, but not limited to solid state media (e.g., SRAM, DRAM, DDRAM, ROM, PROM, EPROM, flash memory, solid state drive, etc.), removable storage devices (e.g., secure digital (SD) card, mini SD card, micro SD card, memory stick, thumb drive, USB flash drive, ROM cartridge, universal media disc), fixed drive (e.g., magnetic hard disc drive), or the like, individually or in any combination. As seen in FIG. 5, memory circuitry 94 is also configured to store one or more view generation rules 96, and or one or more view generation templates 98, as well as the view generator 40.

Figure 6:
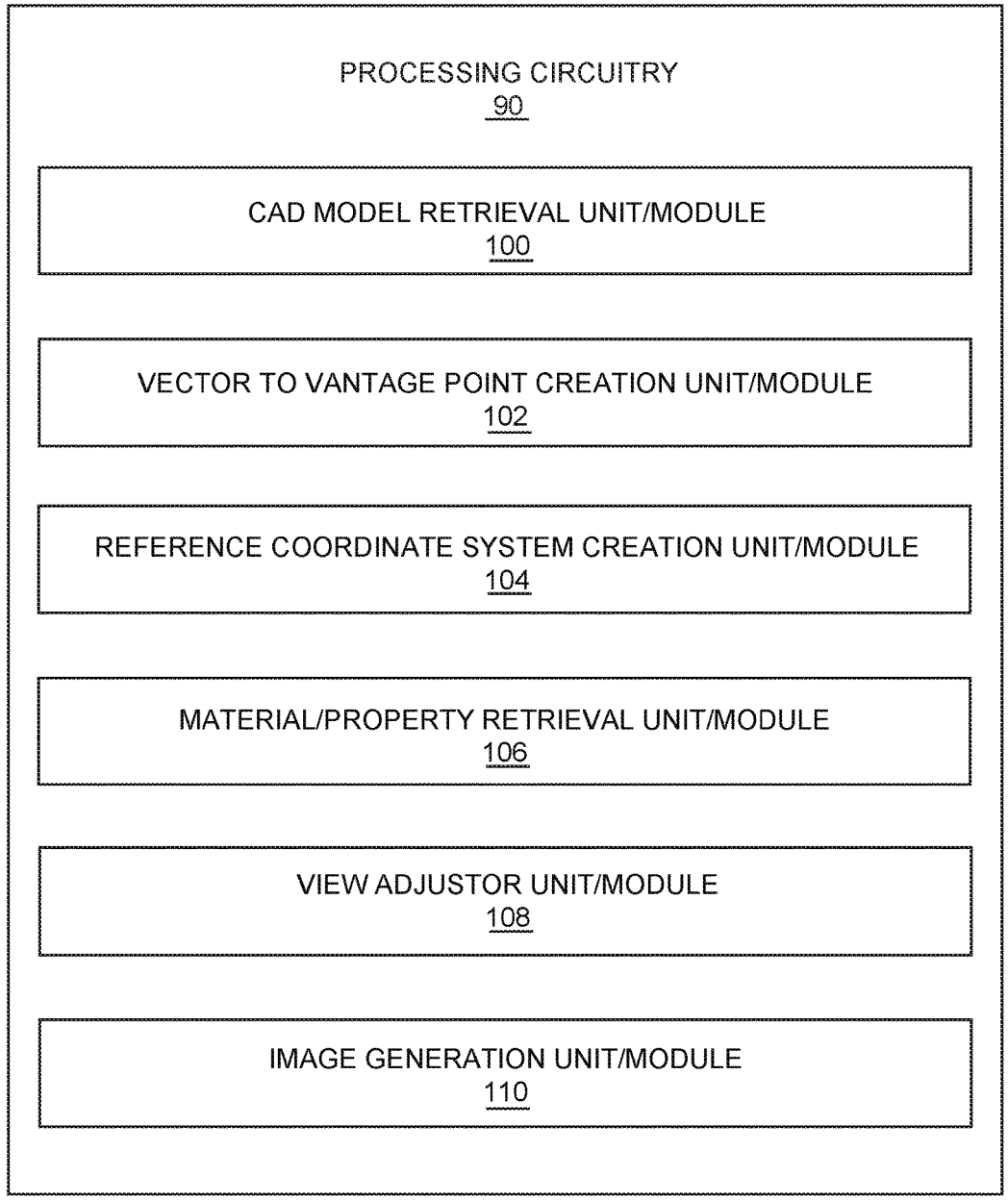
FIG. 6 is a block diagram illustrating processing circuitry configured according to one aspect of the present disclosure.

FIG. 6 is a block diagram illustrating processing circuitry 90 implemented according to different hardware units and software modules (e.g., as view generator 40 stored on memory circuitry 94) according to one aspect of the present disclosure. As seen in FIG. 6, processing circuitry 90 implements a CAD model retrieval unit and/or module 100, a vector-to-vantage point creation unit and/or module 102, an RCS creation unit and/or module 104, a material/property retrieval unit and/or module 106, a view adjustor unit and/or module 108, and an image generation unit and/or module 110.

The CAD model retrieval unit and/or module 100 is configured to obtain the CAD models from repository 22 via a computer network, a local non-transitory media such as memory circuit 94, or in some aspects, from user input via interface circuitry 92. The vector-to-vantage point creation unit and/or module 102 is configured to determine the viewing vectors from information associated with the retrieved CAD model, and based on those vectors, generate the vantage points for the user. The RCS creation unit and/or module 104 is configured to generate the coordinate system for the views to be generated, and the material/property retrieval unit and/or module unit 106 is configured to obtain information regarding the materials and properties of the retrieved CAD model. The view adjustor unit and/or module 108 adjusts the view fields of the views to be generated and determines which portion(s) of the object described by the CAD model are of interest so that they can be included in the generated views. The image generation unit and/or module 110 is configured to generate the views 14, 16 based on the retrieved CAD models, the RCS created by the RCS creation unit and/or module 104, and on the orientation vectors previously described.

Aspects of the present disclosure further include various methods and processes, as described herein, implemented using various hardware configurations configured in ways that vary in certain details from the broad descriptions given above. For instance, one or more of the processing functionalities discussed above can be implemented using dedicated hardware, rather than a microprocessor configured with program instructions, depending on, e.g., the design and cost tradeoffs for the various approaches, and/or system-level requirements.

Figure 7:
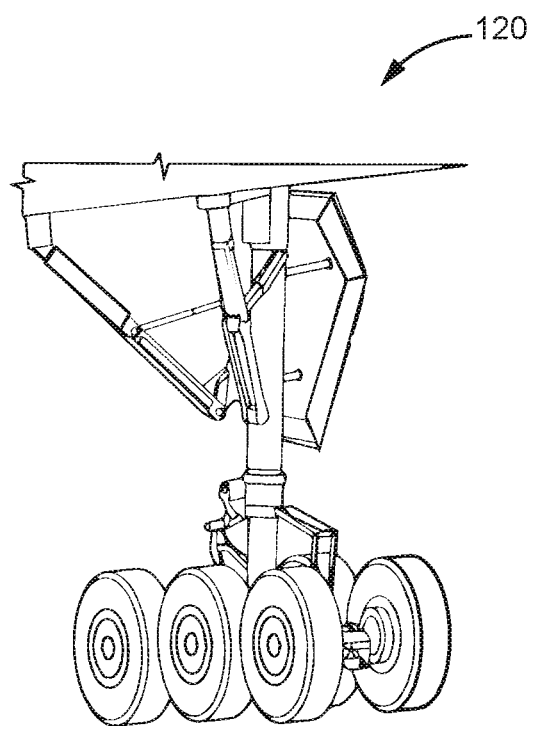
FIG. 7 illustrates an assembly for which one or more views can be generated according to one aspect of the present disclosure.

It should be noted that the previous aspects describe the present disclosure in the context of generating views 14, 16 specifically for an equipment rack 12. However, this is merely for illustrative purposes. Those of ordinary skill in the art will readily appreciate that aspects of the present disclosure are also well-suited for generating views of other parts, assemblies, systems, sub-assemblies, sub-systems, and the like. For instance, as seen in FIG. 7, such suitable parts, assemblies, and systems include, but are not limited to, landing gear 120 for aircraft.

Additionally, aspects of the present disclosure are well-suited for generating technical views of parts and assemblies for publications associated with a wide variety of complex systems. As seen in FIG. 8, such systems include, but are not limited to, fixed-wing aircraft 130, ships 140, sub-surface vessels 150, rotorcraft 160, industrial or nuclear facilities 170, automobiles 180, and other system not specifically shown here, such as those associated with spacecraft.

The foregoing description and the accompanying drawings represent non limiting examples of the methods and apparatus taught herein. As such, the aspects of the present disclosure are not limited by the foregoing description and accompanying drawings. Instead the aspects of the present disclosure are limited only by the following claims and their legal equivalents.

What is claimed is:

1. A computing device comprising:
    interface circuitry configured to send and receive data; and
    processing circuitry operatively connected to the interface circuitry and configured to:
        generate a reference coordinate system for an object to be illustrated to a user based on a vantage point of the user and an orientation vector, wherein the reference coordinate system defines one or more axes about which one or more views of the object can be rotated, and wherein the orientation vector defines an orientation of the one or more views;
        determine which part of the object is a portion of interest based on metadata associated with the object and use-case information associated with the one or more views, wherein the use-case information defines how the one or more views are intended to be used in a publication;
        determine a number and type of views of the object to generate based on a complexity of the intended use case;
        define an orientation relationship for the object relative to the vantage point of the user based on the vantage point of the user and on the use-case information; and
        generate the number and type of views of the object to display to the user based on the orientation relationship, wherein the number and type of views is generated to visually emphasize the portion of interest.

2. The computing device of claim 1 wherein the processing circuitry is configured to determine the vantage point of the user by:
    obtain a viewing vector for the object, wherein the viewing vector defines a distance and direction from which the user will visually perceive the number and type of views of the object that were generated for display; and
    determine the vantage point based on the viewing vector, wherein the vantage point defines a location from which the user will visually perceive the number and type of views of the object that were generated for display.

3. The computing device of claim 2 wherein to determine the vantage point, the processing circuitry is configured to:
    determine an object type for the object based on information associated with the object; and
    execute a linear extrapolation algorithm to calculate the vantage point based on the object type.

4. The computing device of claim 1 wherein to determine which part of the object is a portion of interest, the processing circuitry is configured to determine a geometry associated with the object.

5. The computing device of claim 1 wherein the orientation vector defines a top and a bottom of each of the number and type of views generated for display relative to the vantage point.

6. The computing device of claim 1 wherein the processing circuitry is further configured to determine how much of the object is to be generated for the number and type of views for context.

7. The computing device of claim 1 wherein the processing circuitry is further configured to:
    obtain material property information associated with the object; and
    determine how much of the object to generate in the number and type of views based on the material property information.

8. The computing device of claim 1 wherein the processing circuitry is configured to obtain a Computer-Aided Design (CAD) file comprising the metadata associated with the object.

9. The computing device of claim 1 wherein the processing circuitry is further configured to:
    determine that the portion of interest is occluded by an occluding item based on an analysis of data associated with a model of the object; and generate the view to visually de-emphasize the occluding item.

10. A method of generating views for technical illustrations, the method comprising:
   generating a reference coordinate system for an object to be illustrated to a user based on a vantage point of the user and an orientation vector, wherein the reference coordinate system defines one or more axes about which one or more views of the object can be rotated, and wherein the orientation vector defines an orientation of the one or more views;
   determining which part of the object is a portion of interest based on metadata associated with the object and use-case information associated with the one or more views, wherein the use-case information defines how the one or more views are intended to be used in a publication;
   determining a number and type of views to generate based on a complexity of a procedure associated with the object;
   defining an orientation relationship for the object relative to the vantage point of the user based on the vantage point of the user and on the use-case information; and
   generating the number and type of views of the object to display to the user based on the orientation relationship, wherein the number and types of view is generated to visually emphasize the portion of interest.

11. The method of claim 10 further comprising determining the vantage point of the user by:
   determining a viewing vector for the object, wherein the viewing vector defines a distance and direction from which the user will visually perceive the number and type of views of the object that were generated for display; and
   determining the vantage point based on the viewing vector, wherein the vantage point defines a location from which the user will visually perceive the number and type of views of the object that were generated for display.

12. The method of claim 11 wherein:
   determining the viewing vector for the object comprises determining the viewing vector from geometry information associated with the object; and
   determining the vantage point further comprises determining the vantage point based on information identifying the object.

13. The method of claim 10 wherein the use-case information associated with the object comprises:
   information identifying the object.

14. The method of claim 13 wherein determining which part of the object is a portion of interest is further based on a geometry associated with the object.

15. The method of claim 10 wherein the orientation vector defines a top and bottom of each of the number and type of views generated for display relative to the vantage point.

16. The method of claim 10 further comprising:
   obtaining material property information associated with the object; and
   determining how much of the object is to be generated for the number and type of views for context based on the material property information.

17. The method of claim 10 further comprising obtaining a Computer-Aided Design (CAD) file comprising the metadata associated with the object.

18. A non-transitory computer-readable storage medium having computer instructions stored thereon that, when executed by a processing circuit configured to generate views of an object for technical illustrations, causes the processing circuit to:
   generate a reference coordinate system for an object to be illustrated to a user based on a vantage point of the user and an orientation vector, wherein the reference coordinate system defines one or more axes about which one or more views of the object can be rotated, and wherein the orientation vector defines an orientation of the one or more views;
   determine which part of the object is a portion of interest based on metadata associated with the object and use-case information associated with the object, wherein the use-case information defines how the one or more views are intended to be used in a publication;
   determine a number and type of views to generate based on a complexity of the intended use case;
   define an orientation relationship for the object relative to the vantage point of the user based on the vantage point of the user and on the use-case information; and
   generate the number and type of views of the object to display to the user based on the orientation relationship, wherein the number and type of views is generated to visually emphasize the portion of interest.

19. The non-transitory computer-readable storage medium of claim 18 wherein to determine which part of the object is a portion of interest, the computer instructions, when executed by the processing circuit, configure the processing circuit to determine a geometry associated with the object.

20. The non-transitory computer-readable storage medium of claim 18 wherein the orientation vector defines a top and a bottom of each of the number and type of views to be generated for display relative to the vantage point.

21. The non-transitory computer-readable storage medium of claim 18 wherein the computer instructions, when executed by the processing circuit, configure the processing circuit to determine how much of the object is to be generated for the number and type of views for context.

* * * * *